United States Patent [19]

Tsushima

[11] Patent Number: 4,649,427
[45] Date of Patent: Mar. 10, 1987

[54] VIDEO SIGNAL DELAY CIRCUIT

[75] Inventor: Takuya Tsushima, Ayase, Japan

[73] Assignee: Victor Company of Japan, Ltd., Yokohama, Japan

[21] Appl. No.: 708,218

[22] Filed: Mar. 5, 1985

[30] Foreign Application Priority Data

Mar. 6, 1984 [JP] Japan .................... 59-43644

[51] Int. Cl.⁴ .................. H04N 5/14; H04N 5/213; H04N 3/14
[52] U.S. Cl. ................... 358/160; 358/167; 358/213
[58] Field of Search ........... 358/336, 340, 337, 160, 358/167, 213, 241

[56] References Cited
U.S. PATENT DOCUMENTS 4,349,743  9/1982  Ohba et al. ................. 250/578
4,536,795  8/1985  Hirota et al. ............... 358/213

FOREIGN PATENT DOCUMENTS

1011261   5/1980  European Pat. Off. .
2618225  10/1977  Fed. Rep. of Germany .
3013253  10/1980  Fed. Rep. of Germany .
1412463  11/1975  United Kingdom .

Primary Examiner—Michael A. Masinick
Assistant Examiner—Cynthia Smith
Attorney, Agent, or Firm—Michael N. Meller

[57] ABSTRACT

A video signal delay circuit comprises a plurality of rows of input horizontal transfer registers, a plurality of input vertical transfer gates, a plurality of columns of vertical transfer registers, a plurality of output vertical transfer gates, a plurality of rows of output horizontal transfer registers, a horizontal transfer clock pulse generating circuit, a vertical transfer clock pulse generating circuit, and a selecting circuit. The selecting circuit selectively supplies a horizontal transfer clock pulse to an arbitrarily selected one of the plurality of rows of input horizontal transfer registers and to an arbitrarily selected one of the plurality of rows of output horizontal transfer registers based on at least horizontal and vertical synchronizing signals within an input composite video signal. The selecting circuit supplies the input composite video signal to the arbitrarily selected one of the plurality of rows of input horizontal transfer registers and selectively obtains an output composite video signal of only the arbitrarily selected one of the plurality of rows of output horizontal transfer registers.

9 Claims, 10 Drawing Figures

VIDEO SIGNAL DELAY CIRCUIT

BACKGROUND OF THE INVENTION

The present invention generally relates to video signal delay circuits, and more particularly to a video signal delay circuit at least comprising a semiconductor delay circuit part in which an input horizontal transfer register, a plurality of columns of vertical transfer registers and an output horizontal transfer register are arranged in a matrix arrangement. The video signal delay circuit according to the present invention delays an input composite video signal by a predetermined delay time, which predetermined delay time is variable.

Conventionally, in a video signal reproducing apparatus such as a video tape recorder (VTR), a delay circuit for providing a delay of one horizontal scanning period (1H) or one field is provided within a noise reduction circuit which reduces noise included within a reproduced composite video signal by use of the so-called line correlation or field correlation. A delay circuit is also often used for performing a dropout compensation. In other words, a delay circuit is conventionally used for various purposes.

In a conventional video signal delay circuit, an input composite video signal applied to an input terminal is delayed by a predetermined delay time in a semiconductor delay circuit part and is then produced through an output terminal after being passed through a lowpass filter wherein a frequency component of a horizontal transfer pulse is eliminated. The semiconductor delay circuit part comprises an input horizontal transfer register, an input vertical transfer gate, vertical transfer registers, an output vertical transfer gate, and an output horizontal transfer register. For example, as previously proposed in U.S. Pat. No. 4,536,795 entitled VIDEO MEMORY DEVICE, of which the assignee is the same as the assignee of the present application, the input horizontal transfer register, the vertical transfer registers and the output horizontal transfer register are constituted by cells of charge coupled devices (CCDs) which are arranged in a (n+1) row by m column matrix arrangement, where m and n are natural numbers. m cells in the first row of the matrix arrangement constitute the input horizontal transfer register. (n−1) xm cells in the second through n-th rows of the matrix arrangement constitute m columns of the vertical transfer registers. Further, m cells in the (n+1)-th row of the matrix arrangement constitute the output horizontal transfer register.

The input and output horizontal transfer registers are supplied with a horizontal transfer pulse which is generated based on a horizontal synchronizing signal within the input composite video signal. A data obtained by sampling the input composite video signal by the horizontal transfer pulse, is successively transferred horizontally within the input horizontal transfer register every time a horizontal transfer pulse is supplied thereto. m sampled data are supplied from the input horizontal transfer register to the vertical transfer registers in parallel through the input vertical transfer gate, and the m sampled data are successively transferred vertically within the respective vertical transfer registers at a rate of once for 1H responsive to a vertical transfer pulse which is generated based on a vertical synchronizing signal within the input composite video signal. Hence, the m sampled data stored in the input horizontal transfer register are supplied to the output horizontal transfer register after n vertical transfers in the vertical transfer registers. The m sampled data stored in the output horizontal transfer register are thereafter transferred horizontally responsive to the horizontal transfer pulse, so that the m sampled data are serially supplied to the lowpass filter. As a result, a composite video signal which is delayed by n horizontal scanning periods (nH) is obtained from the lowpass filter and is produced through the output terminal.

However, the conventional video signal delay circuit has a fixed delay time determined by the number of rows (number of stages which is (n−1) in the case described above) of the vertical transfer registers, and the delay time cannot be varied. Hence, a delay circuit for delaying the composite video signal by one field minus 1H (or one field plus 1H) cannot be used in common for the composite video signal employing 525 scanning lines and the composite video signal employing 625 scanning lines.

In addition, in a case where a signal processing is performed by use of the field correlation in the video signal, the conventional delay circuit can only provide a delay time which is a natural number multiple of 1H because there are a natural number of rows in the vertical transfer registers, although the number of scanning lines is equal to 262.5 for the system employing 525 scanning lines and 312.5 for the system employing 625 scanning lines and an odd number of 0.5 is introduced due to the interlaced scanning of the television video signal. Hence, the field correlation is deviated in the upward or downward direction of the picture, and an accurate field correlation does not exist.

Further, the conventional delay circuit cannot perform a horizontal transfer while a vertical transfer is being performed. Thus, there is a problem in that a signal in a time period corresponding to a time period in which the vertical transfer is performed, does not exist in the delayed composite video signal produced from the delay circuit.

SUMMARY OF THE INVENTION

Accordingly, it is a general object of the present invention to provide a novel and useful video signal delay circuit in which the problems described heretofore are eliminated.

Another and more specific object of the present invention is to provide a video signal delay circuit in which a plurality of rows of input horizontal transfer registers and a plurality of rows of output horizontal transfer registers are provided to cross a plurality of columns of vertical transfer registers and the plurality of rows of input and output horizontal transfer registers operate independently. Parallel output signals of an arbitrary row of input horizontal transfer register selected from among the plurality of rows of input horizontal transfer registers are passed through the plurality of columns of vertical transfer registers, and are supplied to an arbitrary row of output horizontal transfer register selected from among the plurality of rows of output horizontal transfer registers. A composite video signal which is delayed by a predetermined delay time is obtained from the arbitrary row of output horizontal transfer register selected from among the plurality of rows of output horizontal transfer registers. According to the video signal delay circuit of the present invention, it is possible to selectively obtain two or more delay times without modifying the construction of a semiconductor delay circuit part, and a desired delay time can be obtained by the same circuit regardless of whether the input composite video signal to be delayed is a composite video signal employing 525 scanning lines or 625 scanning lines.

Still another object of the present invention is to provide a video signal delay circuit in which switching circuit means normally passes selectively one of an output delayed composite video signal of the arbitrary row of output horizontal transfer register selected from among the plurality of rows output horizontal transfer registers and a constant voltage or the input composite video signal, and passes selectively the constant voltage or the input composite video signal at least during a time period in which a vertical transfer clock pulse is generated. According to the video signal delay circuit of the present invention, the input composite video signal or a constant voltage such as a pedestal level or a synchronizing signal tip level is produced selectively during a time period in which a vertical transfer is performed. Thus, no signal lack is introduced during the time period in which the vertical transfer is performed.

A further object of the present invention is to provide a video signal delay circuit in which first and second input horizontal transfer registers or first and second output horizontal transfer registers are alternately operated for every approximately one field. In a case where the first and second input horizontal transfer registers are alternately operated, only one of the first and second output horizontal transfer registers is constantly operated. In a case where the first and second output horizontal transfer registers are alternately operated, only one of the input and output horizontal transfer registers is constantly operated. In either of the two cases, a composite video signal which is delayed by a predetermined delay time is obtained from the first or second output horizontal transfer register, which predetermined delay time is alternately switched for every one field between a delay time of one field plus 0.5H and a delay time of one field minus 0.5H, where H represents one horizontal scanning period of the input composite video signal. According to the video signal delay circuit of the present invention, the delay time can be alternatively switched between two values, that is, the delay time of one field plus 0.5H and the delay time of one field minus 0.5H. For this reason, when the video signal delay circuit is used as a one field delay circuit within a recursive noise reduction circuit which uses the field correlation to reduce the noise, for example, it is possible to eliminate the smear which is generated in the reproduced picture in the case of the conventional noise reduction circuit.

Another object of the present invention is to provide a video signal delay circuit in which the points in time when the operating register is switched from one register to another among the plurality of input horizontal transfer registers or among the plurality of output horizontal transfer registers are selected within a vertical blanking period of the input composite video signal. According to the video signal delay circuit according to the present invention, no unnatural disturbances are generated in the reproduced picture because the switching of the delay time takes place within the vertical blanking period. Further, it is possible to compensate for the signal lack which occurs when the delay time is switched for every one field.

Other objects and further features of the present invention will be apparent from the following detailed description when read in conjunction with the accompanying drawings.

DETAILED DESCRIPTION

Figure 1:
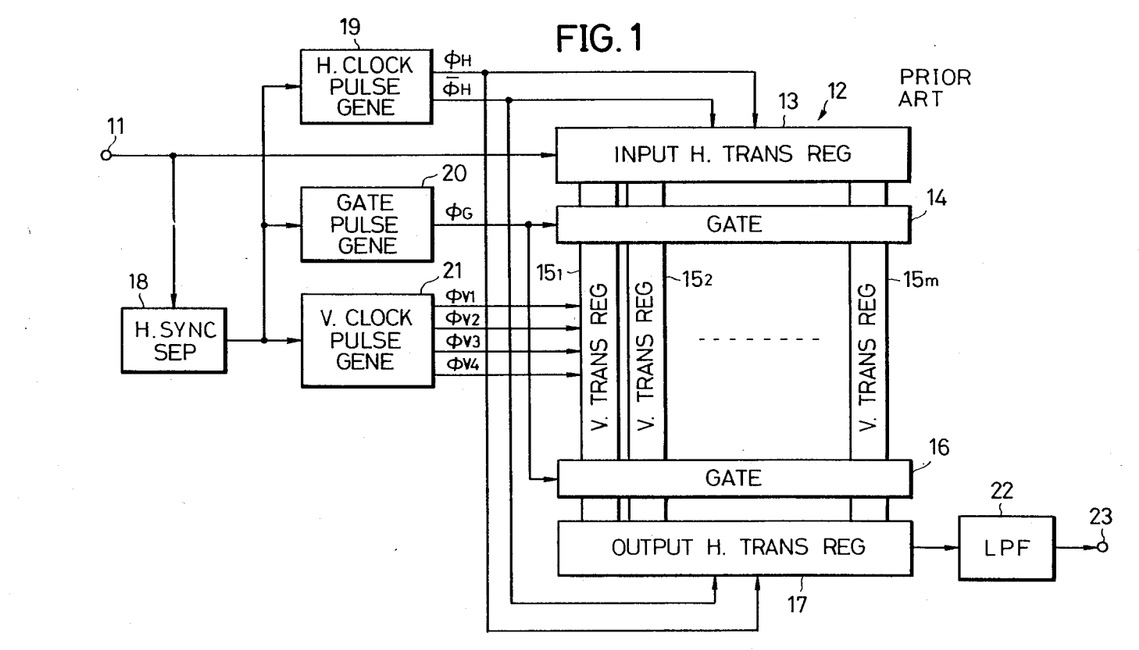
FIG. 1 is a system block diagram showing an example of a conventional video signal delay circuit.
Figure 2:
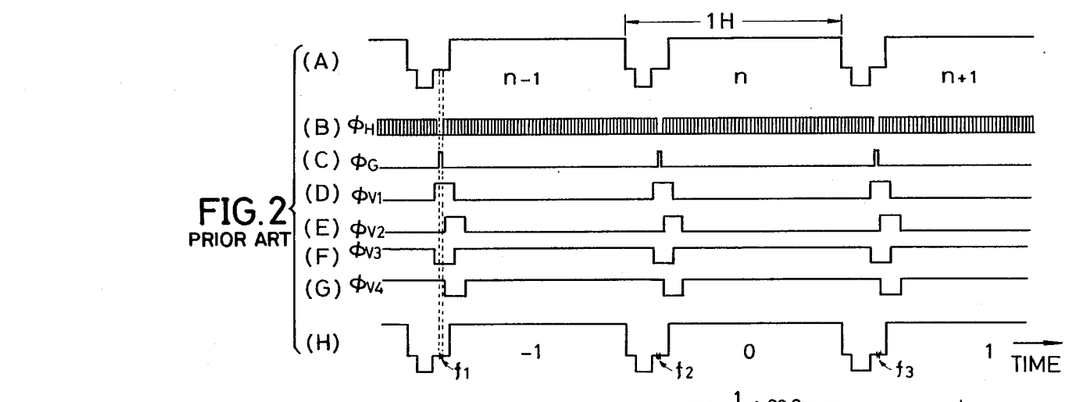
FIGS. 2(A) through 2(H), FIGS. 3(A) through 3(D) and FIGS. 4(A) through 4(C) respectively show signal waveforms for explaining the operation of the block system shown in FIG. 1.

First, a description will be given with respect to an example of a conventional video signal delay circuit, by referring to FIG. 1. In FIG. 1, an input composite video signal shown in FIG. 2(A) is applied to an input terminal 11. The input composite video signal is supplied to an input horizontal transfer register 13 within a semiconductor delay circuit part 12 and to a horizontal synchronizing signal separating circuit 18. The semiconductor delay circuit part 12 comprises the input horizontal transfer register 13, an input vertical transfer gate 14, m columns of vertical transfer registers $15_1$ through $15_m$, where m is a natural number, an output vertical transfer gate 16, and an output horizontal transfer register 17.

For example, the registers 13, $15_1$ through $15_m$ and 17 are constituted by a plurality of cells of charge coupled devices (CCDs), and for the reason which will be described later on in the specification, 455 cells are arranged horizontally in each of the horizontal transfer registers 13 and 17. Hence, the number of columns m of the vertical transfer registers $15_1$ through $15_m$ is equal to 455. For example, the vertical transfer registers $15_1$ through $15_m$ each has 261 stages (that is, 26a cells arranged vertically), and a delay time of 262 horizontal scanning periods (262H) is obtained by performing one vertical transfer in one horizontal scanning period (1H).

On the other hand, a horizontal synchronizing signal obtained from the horizontal synchronizing signal separating circuit 18 is supplied to a horizontal transfer clock pulse generating circuit 19, a vertical transfer gate pulse generating circuit 20 and a vertical transfer clock pulse generating circuit 21. The horizontal transfer clock pulse generating circuit 19 generates a horizontal transfer clock pulse $\phi_H$ shown in FIG. 2(B) and a pulse $\overline{\phi_H}$ (not shown) having an inverted phase of the horizontal clock pulses $\phi_H$, and supplies the pulses $\phi_H$ and $\overline{\phi_H}$ to the input and output horizontal transfer registers 13 and 17. The vertical transfer gate pulse generating circuit 20 generates a gate pulse $\phi_G$ shown in FIG. 2(C) which assumes a high level only during a predetermined time period (time period in which the horizontal transfer pulses $\phi_H$ and $\overline{\phi_H}$ are not generated) within a back porch of the input composite video signal, and supplies the gate pulse $\phi_G$ to the input and output vertical transfer gates 14 and 16.

The vertical transfer clock pulse generating circuit 21 generates vertical transfer clock pulses $\phi_{V1}$, $\phi_{V2}$, $\phi_{V3}$ and $\phi_{V4}$ shown in FIGS. 2(D), 2(E), 2(F) and 2(G) having four different phases, once for every 1H. The vertical transfer clock pulses $\phi_{V1}$, $\phi_{V2}$, $\phi_{V3}$ and $\phi_{V4}$ are supplied to the vertical transfer registers $15_1$ through $15_m$.

The input composite video signal is transferred horizontally within the horizontal transfer register 13 responsive to the horizontal transfer clock pulses $\phi_H$ and $\overline{\phi_H}$ and are stored in the horizontal transfer register 13. Hence, the information stored in the horizontal transfer register 13 is essentially a signal obtained by sampling the input composite video signal by the horizontal transfer pulses $\phi_H$ and $\overline{\phi_H}$. When it is assumed that the band of the input composite video signal is in the range of zero to 2.5 MHz, the sampling frequency (that is, the horizontal transfer frequency) must be over 5 MHz according to the sampling theorem. In the present case, the horizontal transfer frequency is set to 7.16 MHz which is 455 times the horizontal scanning frequency $f_H$. The vertical transfer is performed during a time period in the order of 1 μsec within 1H ($\approx$63.5 μsec), and the horizontal transfer cannot be performed during the vertical transfer period in which the vertical transfer is performed. Thus, the semiconductor delay circuit part 12 is designed so that the horizontal transfer is not performed during a time period of 1.4 μsec in which the vertical transfer gates 14 and 16 open.

Figure 3:
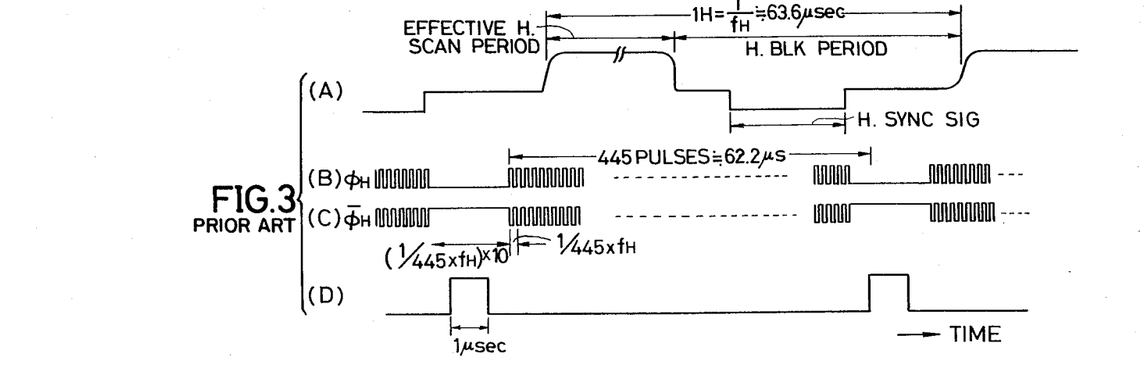

As shown in FIG. 3(D), the vertical transfer gate pulse $\phi_G$ is positioned within the horizontal blanking period of the input composite video signal shown in FIG. 3(A), and the horizontal transfer clock pulses $\phi_H$ and $\overline{\phi_H}$ assume constant levels during a time period of 1.4 μsec including the time period in which the vertical transfer gate pulse $\phi_G$ is generated, as shown in FIGS. 3(B) and 3(C) so that the horizontal transfer is not performed during this time period of 1.4 μsec. This time period of 1.4 μsec corresponds to 10 periods (10 pulses) of the horizontal transfer clock pulses $\phi_H$ and $\overline{\phi_H}$. Accordingly, 445 (=455−10) horizontal transfer clock pulses $\phi_H$ and $\overline{\phi_H}$ are generated within 1H. The number of stages (cells) in the horizontal transfer registers 13 and 17 must be selected so that the input composite video signal is stored to the capacity when 445 horizontal transfer clock pulses are generated. Therefore, the number of stages in the horizontal transfer registers 13 and 17 is selected to 445.

The input composite video signal is transferred horizontally within the input horizontal transfer register 13 by the 445 horizontal transfer clock pulses $\phi_H$ and $\overline{\phi_H}$ having a period of 1/(445h$_H$). Thereafter, the input vertical transfer gate 14 is opened by the vertical transfer gate pulse $\phi_G$ having the width of 1 μsec, and the 445 sampled information stored in the input horizontal transfer register 13 are supplied in parallel to the respective 445 columns of vertical transfer registers $15_1$ and $15_m$, where m=445 in this case. The vertical transfer registers $15_1$ through $15_m$ transfer the incoming sampled information to a subsequent stage (subsequent row) every time the four vertical transfer clock pulses $\phi_{V1}$ through $\phi_{V4}$ are applied thereto. After 262 vertical transfers take place in the vertical transfer registers $15_1$ through $15_m$, the 445 sampled information are supplied in parallel to the output horizontal transfer register 17 through the output vertical transfer gate 16. The output horizontal transfer register 16 serially produces the parallel sampled information within 1H, based on the horizontal transfer clock pulses $\phi_H$ and $\overline{\phi_H}$. The serial output of the output horizontal transfer register 16 is passed through a lowpass filter 22 and is obtained from an output terminal 23. The lowpass filter 22 is provided for the purpose of eliminating the frequency component of the horizontal transfer clock pulses $\phi_H$ and $\overline{\phi_H}$.

Therefore, the input composite video signal is delayed by 262H and is obtained from the output terminal 23.

Figure 4:
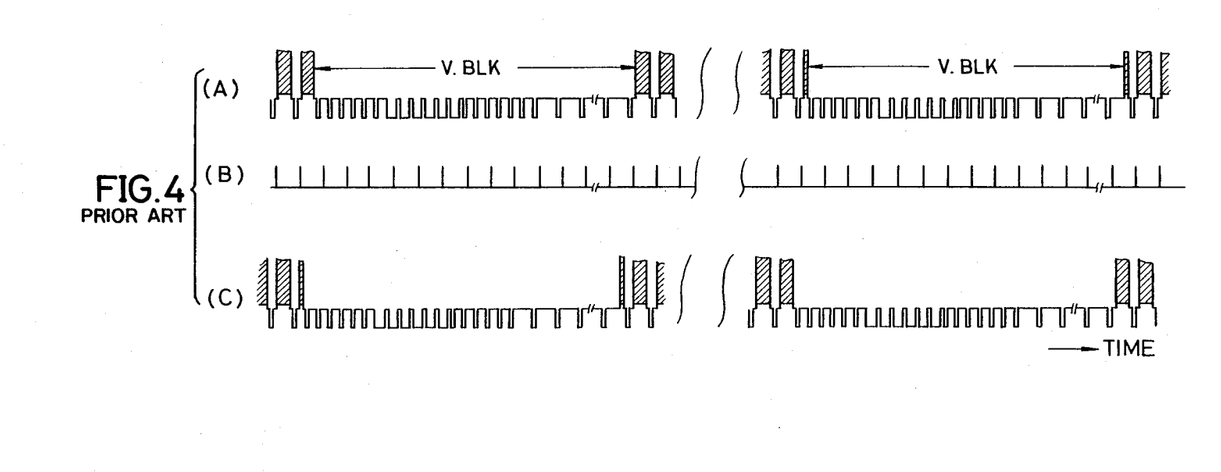

In a case where the input composite video signal is a composite video signal employing 525 scanning lines and the input composite video signal is to be delayed by one field minus 0.5H, the value of m is selected to 262. When it is assumed that the input composite video signal has a waveform shown in FIG. 4(A) in a vicinity of the vertical blanking period (V. BLK) and the vertical transfer clock pulse $\phi_{V1}$ has a waveform shown in FIG. 4(B), a composite video signal which is delayed by 262H and has a waveform shown in FIG. 4(C) is obtained from the output terminal 23.

However, the conventional video signal delay circuit shown in FIG. 1 has the problems described before. Next, description will be given with respect to embodiments of the video signal delay circuit according to the present invention in which the problems are eliminated.

Figure 5:
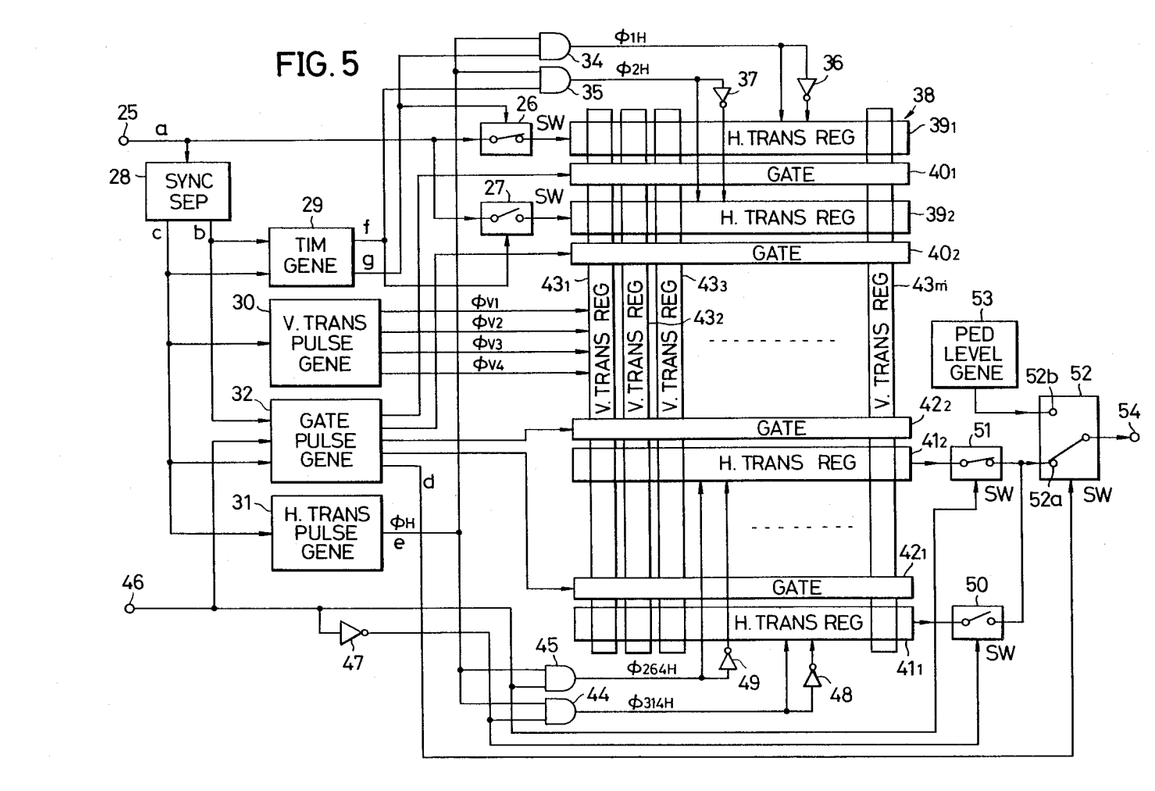
FIG. 5 is a system circuit diagram showing a first embodiment of the video signal delay circuit according to the present invention.
Figure 6:
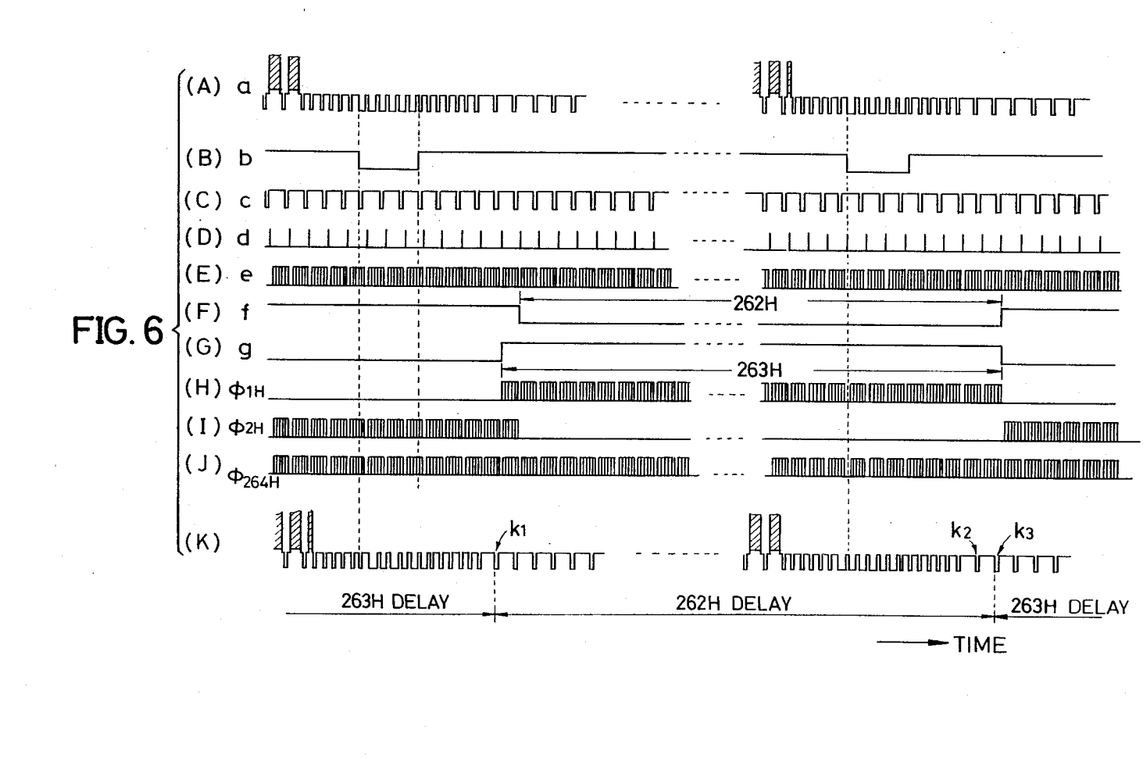
FIGS. 6(A) through 6(K) shows signal waveforms for explaining the operation of the circuit system shown in FIG. 5.

In FIG. 5 which shows a first embodiment of the video signal delay circuit according to the present invention, an input composite video signal a shown in FIG. 6(A) is applied to an input terminal 25. The input composite video signal a is of the system employing 525 scanning lines, and FIG. 6(A) shows the waveform in vicinities of the vertical blanking period in the odd and even fields. The input composite video signal is supplied to switching circuits 26 and 27 and a synchronizing signal separating circuit 28. The synchronizing signal separating circuit 28 separates horizontal and vertical synchronizing signals from the input composite video signal a.

A vertical synchronizing signal b shown in FIG. 6(B) and a horizontal synchronizing signal c shown in FIG. 6(C) which are obtained from the synchronizing signal separating circuit 28, are both supplied to a timing generating circuit 29 and a vertical transfer gate pulse generating circuit 32. The horizontal synchronizing signal c is also supplied to a vertical transfer clock pulse generating circuit 30 and a horizontal transfer clock pulse generating circuit 31. The vertical transfer clock pulse generating circuit 30 generates the clock pulses $\phi_{V1}$, $\phi_{V2}$, $\phi_{V3}$ and $\phi_{V4}$ of mutually different phases, which clock pulses are the same as the clock pulses generated by the vertical transfer clock pulse generating circuit 21 shown in FIG. 1. The clock pulses $\phi_{V1}$, $\phi_{V2}$, $\phi_{V3}$ and $\phi_{V4}$ from the vertical transfer clock pulse generating circuit 30 are simultaneously supplied to m columns of vertical transfer registers $43_1$ through $43_m$ which will be described later on in the specification. As in the case of the vertical transfer gate pulse generating circuit 20 described before, the vertical transfer gate pulse generating circuit 32 generates a narrow gate pulse d shown in FIG. 6(D) and the like only during a time period in which a semiconductor delay circuit part 38 which will be described later performs a vertical transfer. As shown in FIG. 6(D), the gate pulse d occurs slightly after a rising edge of the horizontal synchronizing signal c, for example, and has a period of 1H. As will be described later on in the specification, the vertical transfer gate pulse generating circuit 32 generates in addition to the gate pulse d a gate pulse of a constant logical value responsive to a scanning line system discrimination signal obtained through an input terminal 46.

On the other hand, the horizontal transfer clock pulse generating circuit 31 generates a pulse e shown in FIG. 6(E). The repetition frequency of the pulse e is greater than or equal to twice the upper limit frequency of the band required for the input composite video signal a, and the pule e assumes a constant level only during a time period including the time period in which the vertical transfer gate pulse d ($\phi_G$) is generated. The pulse e from the horizontal transfer clock pulse generating circuit 31 is supplied as a clock pulse (horizontal transfer clock pulse) $\phi_H$ for horizontal transfer to one input terminal of each of 2-input AND circuits 34, 35, 44 and 45.

The timing generating circuit 29 generates timing pulses for selectively operating input horizontal transfer registers $39_1$ and $39_2$ which will be described later, so as to obtain an arbitrary delay time. For example, the timing generating circuit 29 generates a timing pulse f shown in FIG. 6(F) which falls in phase synchronism with the second horizontal synchronizing signal after an equalizing pulse which occurs after the vertical synchronizing signal and thereafter rises when a time of 262H elapses, which timing pulse f has a period of two fields. For example, the timing generating circuit 29 also generates a timing pulse g shown in FIG. 6(G) which rises at a time of 1H before a falling edge of the pulse f and thereafter falls when a time of 263H elapses, which timing pulse g has a period of two fields. The timing pulse f is applied to the other input terminal of the AND circuit 35. The timing pulse f is also applied to the switching circuit 27 as a switching pulse, and the switching circuit 27 is turned ON during a high-level period of the switching pulse and is turned OFF during a low-level period of the switching pulse. On the other hand, the timing pulse g is applied to the other input terminal of the AND circuit 34. The timing pulse g is also applied to the switching circuit 26 as a switching pulse, and the switching circuit 26 is turned ON during a high-level period of the switching pulse and is turned OFF during a low-level period of the switching pulse.

Accordingly, the input composite video signal a from the input terminal 25 passes through the switching circuit 26 during the time period of 263H in which the timing pulse g assumes a high level, and is supplied serially to the first input horizontal transfer register $39_1$ which is arranged in the first row of the semiconductor delay circuit part 38. During this time period of 263H, the input composite video signal a is successively transferred to the right within the input horizontal transfer register $39_1$ shown in FIG. 5 responsive to a horizontal transfer clock pulse $\phi_{1H}$ shown in FIG. 6(H) from the AND circuit 34 and a horizontal transfer clock pulse $\overline{\phi_{1H}}$ from an inverter 36.

During a next time period of 263H in which the timing pulse f, which rises simultaneously as the fall in the timing pulse g, assumes a high level, the input composite video signal a passes through the switching circuit 27 and is supplied serially to the second input horizontal transfer register $39_2$ which is arranged in the second row of the semiconductor delay circuit part 38. During this time period of 263H, the input composite video signal a is successively transferred to the right within the input horizontal transfer register $39_2$ shown in FIG. 5 responsive to a horizontal transfer clock pulse $\phi_{2H}$ shown in FIG. 6(I) from the AND circuit 35 and a horizontal transfer clock pulse $\overline{\phi_{2H}}$ from an inverter 37.

On the other hand, the pulse e supplied to the AND circuit 44 is subjected to a logical multiplication with an output signal of an inverter 47 which receives the scanning line system discrimination signal from the input terminal 46. The pulse e supplied to the AND circuit 45 is subjected to a logical multiplication with the scanning line system discrimination signal from the input terminal 46. The scanning line system discrimination signal is a binary signal which assumes a high level when the input composite video signal a is of the system employing 525 scanning lines and assumes a low level when the input composite video signal a is of the system employing 625 scanning lines. Accordingly, when it is assumed that the input composite video signal a is of the system employing 525 scanning lines, the AND circuit 44 constantly produces a low-level signal. A first output horizontal transfer register $41_1$ which is arranged in the 314-th row of the semiconductor delay circuit part 38 is supplied with the low-level output signal of the AND circuit 44 and a high-level output signal of an inverter 48 which receives the low-level output signal of the AND circuit 44, and is prohibited of the horizontal transfer. On the other hand, the pulse e is passed as it is through the AND circuit 45. Hence, a pulse shown in FIG. 6(J) is produced from the AND circuit 45 as a horizontal transfer clock pulse $\phi_{264}H$. The output horizontal transfer clock pulse $\phi_{264H}$ of the AND circuit 45 is supplied to a second output horizontal transfer register $41_2$ which is arranged in the 264-th row of the semiconductor delay circuit part 38. The output horizontal transfer clock pulse $\phi_{264H}$ of the AND circuit 45 is inverted in an inverter 49, and an output horizontal transfer clock pulse $\overline{\phi_{264H}}$ of the inverter 49 is also supplied to the output horizontal transfer register $41_2$.

In the case where the input composite video signal a is of the system employing 525 scanning lines, the vertical transfer gate pulse generating circuit 32 supplies the gate pulse d to an input vertical transfer gate $40_1$ during the high-level period of the timing pulse g. The vertical transfer gate pulse generating circuit 32 supplies the gate pulse d to an input vertical transfer gate $40_2$ during the high-level period of the timing pulse f. During other time periods, the vertical transfer gate pulse generating circuit 32 supplies a low-level signal to the input vertical transfer gates $40_1$ and $40_2$ and keeps the input vertical transfer gates $40_1$ and $40_2$ in a closed state. At the same time, the vertical transfer gate pulse generating circuit 32 constantly supplies the gate pulse d to an output vertical transfer gate $42_2$ and to a switching circuit 52 as a switching pulse, and supplies a low-level signal to an output vertical transfer gate $42_1$ to constantly keep the output vertical transfer gate $42_1$ in a closed state.

In a case where the input composite video signal a is of the system employing 625 scanning lines, the vertical transfer gate pulse generating circuit 32 constantly supplies the gate pulse d to the output vertical transfer gate $42_1$ and the switching circuit 52 and constantly supplies a high-level signal to the output vertical transfer gate $42_2$ to constantly keep the output vertical transfer gate $42_2$ in an open state. The vertical transfer gate pulse generating circuit 32 repeats a sequence in which the gate pulse d is applied to the input vertical transfer gate $40_1$ (or $40_2$) during a first time period of 312H, supplied to both the input vertical transfer gates $40_1$ and $40_2$ during a second time period of 1H and supplied to the input vertical transfer gate $40_2$ (or $40_1$) during a third time period of 312H.

Figure 7:
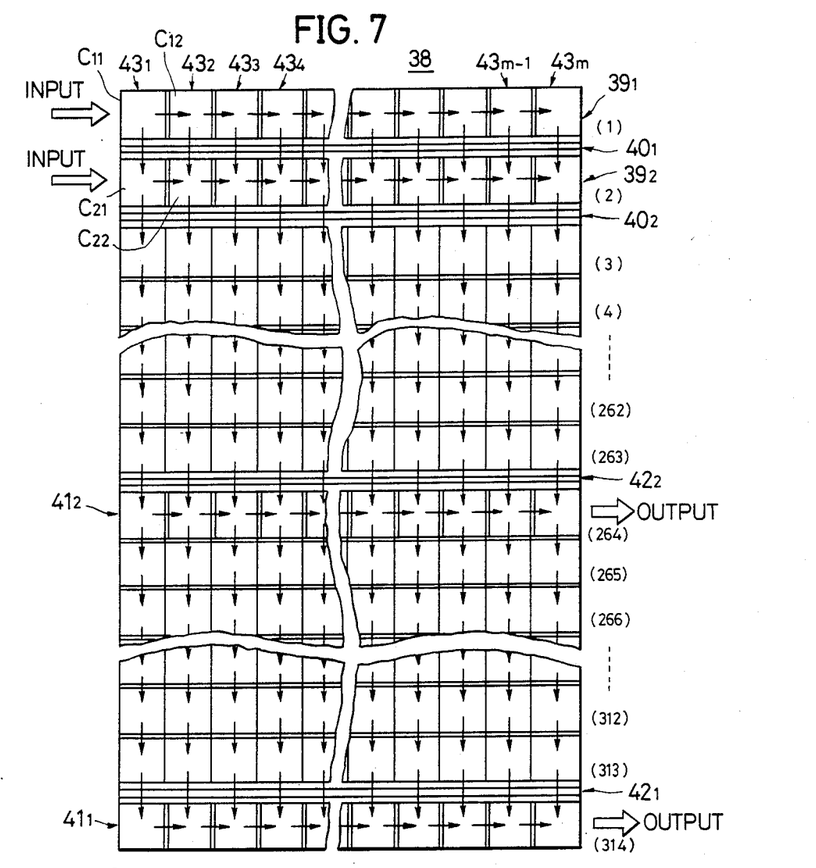
FIG. 7 shows an embodiment of the construction of a semiconductor delay circuit part within the circuit system shown in FIG. 5.

A description will now be given with respect to the construction of the semiconductor delay circuit part 38. In FIG. 7, the semiconductor delay circuit part 38 comprises 314xm charge transfer parts (cells) such as charge coupled devices (CCDs) which are arranged in a 314 row by m column matrix arrangement. The m cells in each of first and second rows of the matrix arrangement constitute the input horizontal transfer registers $39_1$ and $39_2$. The m cells in each of 314-th and 264-th rows of the matrix arrangement constitute the output horizontal transfer registers $41_1$ and $41_2$. The cells in the second through the 313-th rows in the matrix arrangement, between the horizontal transfer registers $39_1$ and $41_1$, constitute the m columns of vertical transfer registers $43_1$ through $43_m$. Accordingly, the cells of the horizontal transfer registers $39_2$ and $41_2$ also constitute a part of the vertical transfer registers $43_1$ through $43_m$. In addition, the vertical transfer gates $40_1$ and $40_2$ are formed on the respective parallel output sides of the horizontal transfer registers $39_1$ and $39_2$. The vertical transfer gates $42_1$ and $42_2$ are formed on the respective parallel output sides of the horizontal transfer registers $41_1$ and $41_2$.

A sequence is repeated in which the input composite video signal a is supplied to the input horizontal transfer register $39_1$ (or $39_2$) during a first time period of 262H, supplied to both the input horizontal transfer registers $39_1$ and $39_2$ during a second time period of 1H and supplied to the input horizontal transfer register $39_2$ (or $39_1$) during a third time period of 262H. A first signal (first sampled value) obtained by sampling the input composite video signal a by the first horizontal transfer clock pulse $\phi_{1H}$ or $\phi_{2H}$, is stored in a leftmost cell $C_{11}$ (or $C_{21}$) of the first (or second) row. The first sampled value stored in the cell $C_{11}$ (or $C_{21}$) is transferred to a second leftmost cell $C_{12}$ (or $C_{22}$) of the first (or second) row responsive to the second horizontal transfer clock pulse $\phi_{1H}$ or $\phi_{2H}$, and a second sampled value obtained by sampling the input composite video signal by the second horizontal transfer clock pulse $\phi_{1H}$ or $\phi_{2H}$ is stored in the leftmost cell $C_{11}$ (or $C_{21}$) of the first (or second) row. Similar operations are thereafter repeated every time the horizontal transfer clock pulse $\phi_{1H}$ or $\phi_{2H}$ is applied to the semiconductor delay circuit part 38. Hence, when m horizontal transfer clock pulses $\phi_{1H}$ or $\phi_{2H}$ are applied to the semiconductor delay circuit part 38, the input composite video signal a corresponding to approximately 1H is stored to the full capacity of the input horizontal transfer register $39_1$ or $39_2$.

Thereafter, the vertical transfer clock pulses $\phi_{V1}$ through $\phi_{V4}$ and the gate pulse d are applied to the semiconductor delay circuit part 38. Hence, the m sampled values (composite video signal information corresponding to approximately 1H) stored in the input horizontal transfer register $39_1$ or $39_2$ pass through the vertical transfer gate $40_1$ or $40_2$ and are vertically transferred in parallel to the m cells located on row below and are stored therein. The m sampled values are thereafter vertically transferred in parallel to the m cells located one row below every time the vertical transfer clock pulses $\phi_{V1}$ through $\phi_{V4}$ are applied to the semiconductor delay circuit part 38 with a period of 1H. Accordingly, the m sampled values stored in the input horizontal transfer register $39_1$ is supplied to the output horizontal transfer register $41_2$ when 263 vertical transfers are performed, and sampled values which are delayed by 263H are obtained serially from the output horizontal transfer register $41_2$. The m sampled values which obtained approximately one field after and are stored in the input horizontal transfer register $39_2$, are supplied to the output horizontal transfer register $41_2$ when 262 vertical transfers are performed. Hence, sampled values which are delayed by 262H are obtained serially from the output horizontal transfer register $41_2$.

Returning now to the description of the circuit system shown in FIG. 5, the input horizontal transfer registers $39_1$ and $39_2$ are alternately used for every approximately one field as described before. Hence, a composite video signal which is delayed by a predetermined delay time, which predetermined delay time is alternately switched between a delay time of 263H (262.5H+0.5H, where 262.5H corresponds to the horizontal scanning period in one field) and a delay time of 262H (262.5H−0.5H) for every one field, is obtained from the output horizontal transfer register $41_2$ and is supplied to a switching circuit 51. On the other hand, the output signal of the output horizontal transfer register $41_1$ is supplied to a switching circuit 50. The switching circuit 50 is turned ON only when the input composite video signal a is of the system employing 625 scanning lines and is turned OFF only when the input composite video signal a is of the system employing 525 scanning lines, responsive to the output signal of the inverter 47. On the other hand, the switching circuit 51 is turned ON only when the input composite video signal a is of the system employing 525 scanning lines and is turned OFF only when the input composite video signal a is of the system employing 625 scanning lines, responsive to the scanning line system discrimination signal from the input terminal 46. Accordingly, the switching circuit 51 is turned ON and the switching circuit 50 is turned OFF in this case, and only the output delayed composite video signal of the output horizontal transfer register $41_2$ is passed through the switching circuit 51 and is applied to a terminal 52a of the switching circuit 52. A constant voltage corresponding to the pedestal level of the input composite video signal a is generated from a pedestal level generator 53 and is applied to another terminal 52b of the switching circuit 52.

Figure 8:
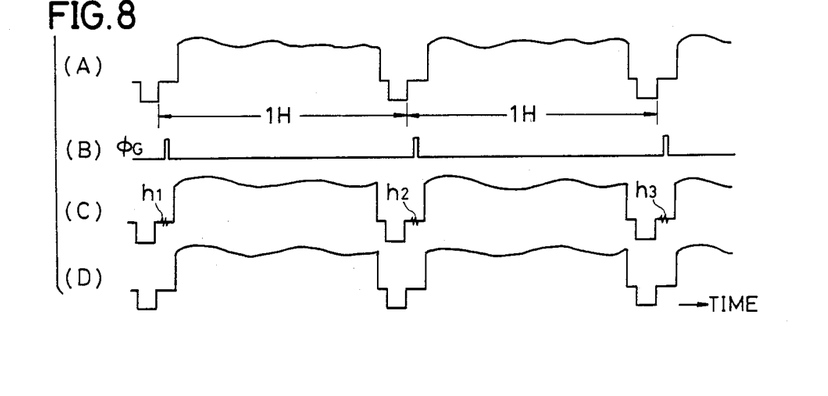
FIGS. 8(A) through 8(D) show signal waveforms for explaining the operation of the circuit system shown in FIG. 5.

When delaying the composite video signal shown in FIGS. 6(A) and 8(A), no horizontal transfer is performed during the time period in which the vertical transfer gate pulse shown in FIGS. 6(D) and 8(B) is generated because the vertical transfer is performed during this time period. For this reason, a signal lack occurs during a time period corresponding to the time period in which no horizontal transfer is performed. As a result, signal lacks $h_1$, $h_2$ and $h_3$ indicated in FIG. 8(C) are introduced in the output delayed composite video signal of the output horizontal transfer register $41_2$ or $41_1$.

The vertical transfer clock pulse is applied to the switching circuit 52 as a switching pulse. During a time period in which the horizontal transfer is performed, the switching circuit 52 is controlled by the switching pulse to selectively pass the delayed composite video signal applied to the terminal 52a thereof. On the other hand, the switching circuit 52 is controlled by the switching pulse to selectively pass the pedestal level applied to the terminal 52b thereof. Hence, as shown in FIGS. 6(K) and 8(D), a delayed composite video signal compensated of the signal lack at the time of the vertical transfer, is produced from the switching circuit 52 and is obtained through an output terminal 54. In FIG. 6(K), a horizontal synchronizing signal $k_1$ at a position where the delay time changes from 263H to 262H is the second horizontal synchronizing signal immediately after the equalizing pulse, and the first synchronizing signal disappears (is not transmitted). A first horizontal synchronizing signal $k_3$ after the delay time changed from 262H to 263H, is identical to a horizontal synchronizing signal $k_2$ of 1H before. In other words, when the delay time is simply switched from the delay time of one field minus 0.5H to the delay time of one field plus 0.5H, there is a signal lack for 1H immediately after the switching of the delay time takes place. However, according to the present embodiment, there is a time period of 1H in which both the timing pulses f and g assume a high level, and during this time period of 1H, the input composite video signal is stored in both the input horizontal transfer registers $39_1$ and $39_2$. For this reason, the signal lack is not introduced in the present embodiment, and the horizontal synchronizing signal $k_2$ is produced twice. As described heretofore, the switching of the delay time takes place within the vertical blanking period.

In a case where the delay circuit in which the delay time is alternately switched between the delay time of one field plus 0.5H and the delay time of one field minus 0.5H for every one field, is used as a one field delay circuit of a recursive noise reduction circuit which uses the field correlation to reduce the noise, it is possible to eliminate the smear which is generated in the reproduced picture when a conventional one field delay circuit having a fixed delay time is used in the recursive noise reduction circuit.

Figure 9:
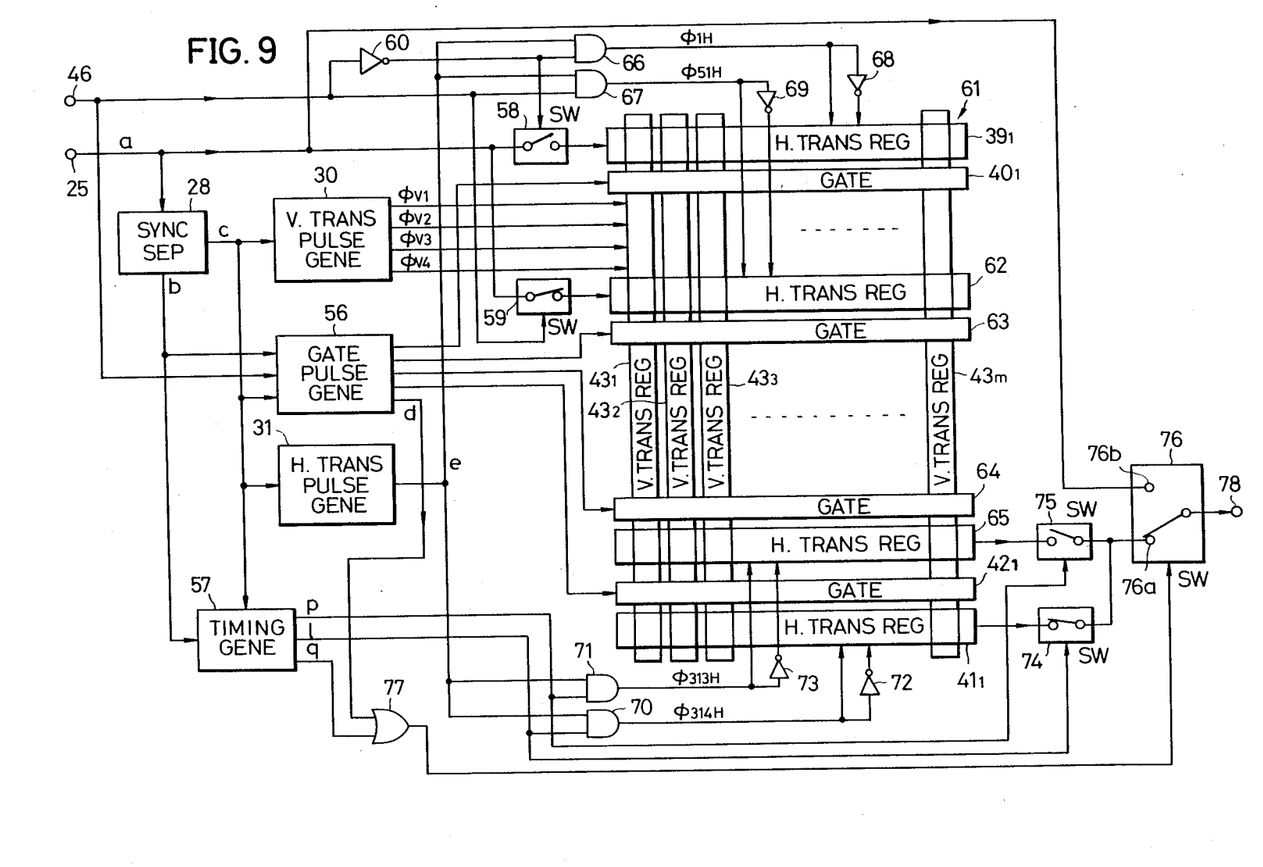
FIG. 9 is a system circuit diagram showing a second embodiment of the video signal delay circuit according to the present invention.

Next, a description will be given with respect to a second embodiment of the video signal delay circuit according to the present invention, by referring to the system circuit diagram shown in FIG. 9. In FIG. 9, those parts which are the same as those corresponding parts in FIG. 5 are designated by the same reference numerals, and their description will be omitted. Further, signals shown in FIGS. 10(B) through 10(E) are identical to the signals shown in FIGS. 6(B) through 6(E).

Figure 10:
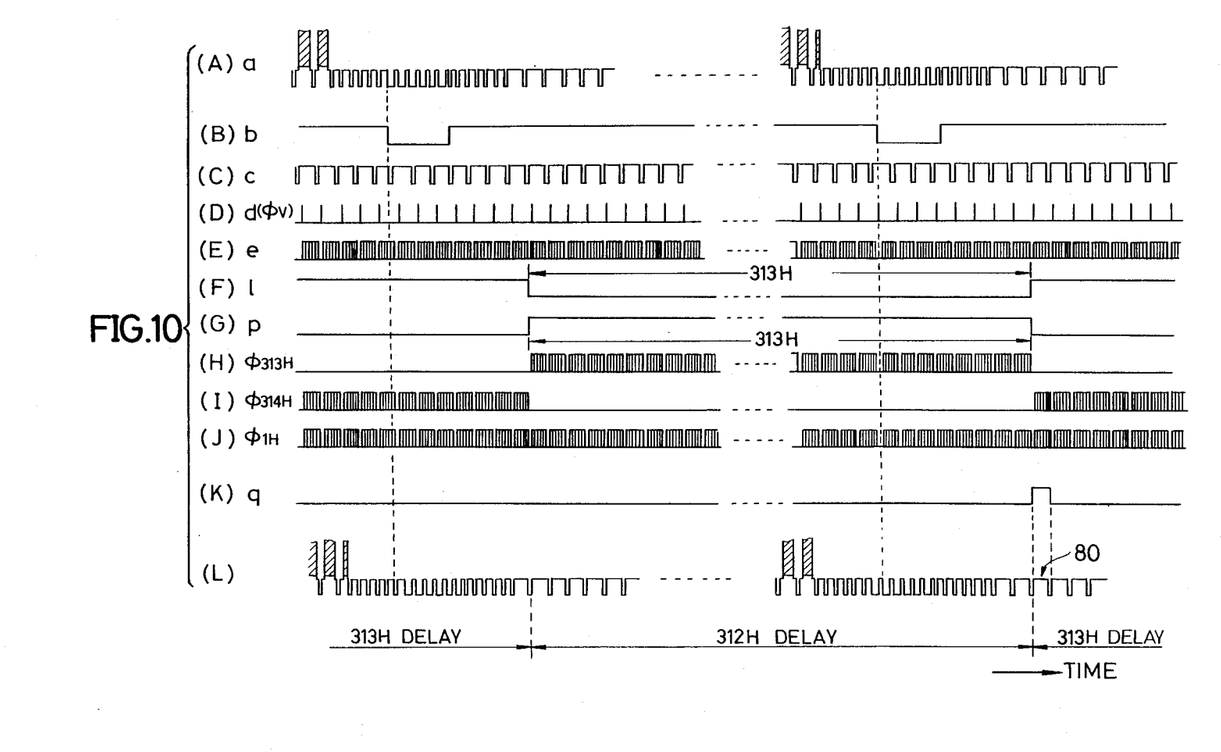
FIGS. 10(A) through 10(L) show signal waveforms for explaining the operation of the circuit system shown in FIG. 9.

In FIG. 9, an input composite video signal a shown in FIG. 10(A) which is of the system employing 625 scanning lines, for example, is applied to the input terminal 25. The input composite video signal a is supplied to switching circuits 58 and 59 and to a terminal 76b of a switching circuit 76 which will be described later. The switching circuit 58 is turned ON during a high-level period of an output signal of an inverter 60 which receives the scanning line system discrimination signal from the input terminal 46. The switching circuit 59 is turned ON during a high-level period of the scanning line system discrimination signal from the input terminal 46. When it is assumed that the input composite video signal a is of the system employing 625 scanning lines, the input composite video signal a passes through the switching circuit 58 and is supplied to the input horizontal transfer register $39_1$. However, the input composite video signal a is blocked by the switching circuit 59, and the input composite video signal a is prevented from being transmitted to a second input horizontal transfer register 62 which is arranged in the 51-st row of a semiconductor delay circuit part 61. In other words, according to the present embodiment, only one of the two input horizontal transfer registers $39_1$ and 62 is operated depending on the system (number of scanning lines) of the input composite video signal a.

In the case where the input composite video signal a is of the system employing 625 scanning lines, a vertical transfer gate pulse generating circuit 56 supplies the gate pulse d to only the input vertical transfer gate $40_1$ between the input vertical transfer gates $40_1$ and 63. Further, the vertical transfer gate pulse generating circuit 56 constantly applies a high-level signal to the input vertical transfer gate 63 so as to constantly keep the input vertical transfer gate 63 in an open state. On the other hand, in the case where the input composite video signal a is of the system employing 525 scanning lines, the vertical transfer gate pulse generating circuit 56 supplies the gate pulse d to only the input vertical transfer gate 63 between the input vertical transfer gates $40_1$ and 63. In addition, the vertical transfer gate pulse generating circuit 56 constantly applies a low-level signal to the input vertical transfer gate $40_1$ to constantly keep the input vertical transfer gate $40_1$ in a closed state.

As in the case of the semiconductor delay circuit part 38 described before, the semiconductor delay circuit part 61 is constituted by 314xm cells which are arranged in a 314 row by m column matrix arrangement. The arrangements of the input horizontal transfer register $39_1$, the input vertical transfer gate $40_1$, the output horizontal transfer register $41_1$, the output vertical transfer gate $42_1$ and the vertical transfer registers $43_1$ through $43_m$ are the same as the arrangements in the semiconductor delay circuit part 38. However, the semiconductor delay circuit part 61 is different from the semiconductor delay circuit part 38 in that the second input horizontal transfer register 52 is arranged in the 51-st row of the matrix arrangement and a second output horizontal transfer register 65 is arranged in the 313-th row of the matrix arrangement. The input vertical transfer gate 63 is provided on the parallel output side of the input horizontal transfer register 62, and an output vertical transfer gate 64 is provided on the parallel output side of the output horizontal transfer register 65. Unlike in the first embodiment, the output horizontal transfer registers $41_1$ and 65 are alternately operated for every one field and the gate pulse d is alternately applied to the vertical transfer gates $42_1$ and 64 for every one field in the present embodiment.

In FIG. 9, an AND circuit 66 performs a logical multiplication between the horizontal transfer clock pulse e shown in FIG. 10(E) and the output signal of the inverter 60, and produces a pulse shown in FIG. 10(J). The output pulse of the AND circuit 66 is supplied directly to the input horizontal transfer register $39_1$ as the horizontal transfer clock pulse $\phi_{1H}$. In addition, the output pulse of the AND circuit 66 is inverted in an inverter 68, and an output pulse of the inverter 68 is supplied to the input horizontal transfer register $39_1$ as the horizontal transfer clock pulse $\overline{\phi_{1H}}$. On the other hand, an AND circuit 67 performs a logical multiplication between the scanning line system discrimination signal from the input terminal 46 and the pulse e, and supplies a horizontal transfer clock pulse $\phi_{51H}$ directly to the input horizontal transfer register 62. The horizontal transfer clock pulse $\phi_{51H}$ from the AND circuit 67 is inverted in an inverter 69, and an output horizontal transfer clock pulse $\overline{\phi_{51H}}$ of the inverter 69 is supplied to the input horizontal transfer register 62. In the present case, the scanning line system discrimination signal constantly assumes a low level. Hence, the output signal level of the AND circuit 67 is constantly low. Consequently, the horizontal transfer register 62 does not perform a horizontal transfer and only performs a vertical transfer.

An AND circuit 70 performs a logical multiplication between the pulse e and a pulse l which is shown in FIG. 10(F) and is obtained from the timing generating circuit 57. As shown in FIG. 10(F), the pulse l falls in phase synchronism with the first horizontal synchronizing signal immediately after the equalizing pulse of the input composite video signal a and thereafter rises when a time period of 313H elapses. The AND circuit 70 produces a pulse shown in FIG. 10(I) as a horizontal transfer clock pulse $\phi_{314H}$. The output pulse of the AND circuit 70 is supplied directly to the output horizontal transfer register $41_1$ on one hand, and is supplied to the output horizontal transfer register $41_1$ through an inverter 72 on the other. On the other hand, an AND circuit 71 performs a logical multiplication between the pulse e and a pulse p which is shown in FIG. 10(G) and is obtained from the timing generating circuit 57. The pulse p has an inverted phase of the pulse l. The AND circuit 71 produces a pulse shown in FIG. 10(H) as a horizontal transfer clock pulse $\phi_{313H}$. The pulse p is supplied directly to the output horizontal transfer register 65 on one hand, and is supplied to the output horizontal transfer register 65 through an inverter 73.

Accordingly, during a time period of 313H beginning from a position within the vertical blanking period of the input composite video signal a and ending at a position within the vertical blanking period of the next field, the output horizontal transfer register 65 is supplied with the horizontal transfer clock pulses $\phi_{313H}$ and $\overline{\phi_{313H}}$ and performs the horizontal transfer. Thus, a composite video signal delayed by 312H is supplied serially to a switching circuit 75 from the output horizontal transfer register 65. During the next time period of 312H, the output horizontal transfer register $41_1$ is supplied with the horizontal transfer clock pulses $\phi_{314H}$ and $\overline{\phi_{314H}}$ and performs the horizontal transfer. Hence, a composite video signal delayed by 313H is supplied serially to a switching circuit 74 from the output horizontal transfer register $41_1$. These operations are alternately performed so that the switching circuit 74 receives the output signal of the output horizontal transfer register 65 during the first time period of 313H and the switching circuit 75 receives the output signal of the output horizontal transfer register $41_1$ during the second time period of 312H. The pulse l described before is applied to the switching circuit 74 as a switching pulse, and the switching circuit 74 is turned ON during a high-level period of the switching pulse and is turned OFF during a low-level period of the switching pulse. Therefore, the switching circuit 74 supplies the delayed composite video signal from the output horizontal transfer register $41_1$ to a terminal 76a of the switching circuit 76 only during the time period of 312H in which the output horizontal transfer register $41_1$ performs the horizontal transfer. On the other hand, the pulse p described before is applied to the switching circuit 75 as a switching pulse, and the switching circuit 75 is turned ON during a high-level period of the switching pulse and is turned OFF during a low-level period of the switching pulse. Accordingly, the delayed composite video signal from the output horizontal transfer register 65 passes through the switching circuit 75 and is supplied to the terminal 76a of the switching circuit 76 only during the time period of 313H in which the output horizontal transfer register 65 performs the horizontal transfer.

As a result, a composite video signal delayed by a predetermined delay time, which predetermined delay time is alternately changed between the delay time of 312H and the delay time of 313H for every approximately one field, is supplied to the terminal 76a of the switching circuit 76. When the delay time switches from the delay time of 312H to the delay time of 313H, a signal lack occurs in the delayed video signal during a time period of 1H immediately after the switching of the delay time takes place. Thus, according to the present embodiment, the timing generating circuit 57 generates a signal g shown in FIG. 10(K) which assumes a high level during a time period corresponding to the signal lack. The signal 0 is passed through an OR circuit 77 and an output signal of the OR circuit 77 is applied to the switching circuit 76 as a switching pulse. The switching circuit 76 is controlled by the output switching pulse of the OR circuit 77, and the switching circuit 76 selectively passes the input composite video signal a applied to the terminal 76b during a high-level period of the switching pulse.

As in the case of the first embodiment described before, the vertical transfer gate pulse d ($\phi_V$) is applied to the switching circuit 76 through the OR circuit 77. Hence, the switching of the switching circuit 76 is controlled so that the switching circuit 76 selectively passes the delayed composite video signal applied to the terminal 76a during the time period in which the horizontal transfer is performed and selectively passes the input composite video signal a applied to the terminal 76b during the time period in which the vertical transfer is performed. Therefore, the signal lack at the time of the vertical transfer is compensated for by the input composite video signal a. A delayed composite video signal shown in FIG. 10(L) which is of the system employing 625 scanning lines is produced from the switching circuit 76 and is obtained from an output terminal 78. As shown in FIG. 10(L), the delay time of the delayed composite video signal is alternately changed between the delay times of 313H and 312H for every one field, and the signal lack which occurs during the time period of 1H in which the delay time switches from the delay time of 312H to the delay time of 313H at the time of the vertical transfer is compensated for by the input composite video signal a. In FIG. 10(L), a signal part 80 corresponding to 1H of the input composite video signal a is inserted into the delayed composite video signal during the high-level period of the pulse q so as to compensate for the signal lack when the delay time is switched from the delay time of 312H to the delay time of 313H.

The present invention is not limited to the embodiments described heretofore, and may be applied to other various applications. In each of the embodiments described heretofore, the delay time is switched for every one field. However, it is obvious that a desired constant delay time is obtainable according to the needs. For example, in the case where the semiconductor delay circuit part 38 shown in FIG. 5 is used, a composite video signal delayed by a delay time of 263H may be obtained from the output horizontal transfer register $41_2$ by keeping the switching circuit 27 turned OFF, supplying the horizontal transfer clock pulse to the input horizontal transfer register $39_1$ and operating the same, supplying the horizontal transfer clock pulse to the output horizontal transfer register $41_2$, operating the output horizontal transfer register $41_2$ by turning the switching circuit 50 OFF and turning the switching circuit 51 ON and performing the vertical transfer at a rate of one per 1H. On the other hand, a composite video signal delayed by a delay time of 262H may be obtained from the output horizontal transfer register $41_2$ by keeping the switching circuit 26 turned OFF, keeping the switching circuit 27 turned ON, operating the input horizontal transfer register $39_2$, operating the output horizontal transfer register $41_2$ and performing the vertical transfer at a rate of once per 1H.

Similarly, in a case where the output horizontal transfer register $41_1$ of the semiconductor delay circuit part 38 shown in FIG. 5 is constantly operated, it is possible to obtain a fixed delay time of 313H by operating the input horizontal transfer register $39_1$ and performing the vertical transfer at a rate of once per 1H. On the other hand, a fixed delay time of 312H may be obtained by operating the input horizontal transfer register $39_2$ and performing the vertical transfer at a rate of once per 1H. It is evident that a delayed composite video signal having a delay time which is alternately switched between the delay time of 313H and the delay time of 312H for every one field, is obtainable from the horizontal transfer register $41_1$. Such alternate switching of the delay time between the delay times of 313H and 312H may be achieved by repeating a sequence in which the switching circuit 26 is turned ON during a first time period of 313H and the switching circuit 26 is turned OFF during a subsequent second time period of 312H, repeating a squence in which the switching circuit 27 is turned ON during a first time period of 313H from a time when the state of the switching circuit 26 is changed from the ON state to the OFF state and the switching circuit 27 is turned OFF during a subsequent second time period of 312H, not supplying the horizontal transfer clock pulse to the horizontal transfer register $41_2$ and keeping the vertical transfer gate $42_2$ in the open state.

On the other hand, in a case where the semiconductor delay circuit part 61 shown in FIG. 9 is used, it is evident from the description given heretofore that a fixed delay time of 313H or 312H is obtainable. It is possible to obtain a delay time of 262H by operating the input and output horizontal transfer registers 62 and 65 and performing the vertical transfer at a rate of once per 1H. It is also possible to obtain a delay time of 263H by operating the input and output horizontal transfer registers 62 and $41_1$ and performing the vertical transfer at a rate of once per 1H. Further, it is possible to alternately switch the delay time between a delay time of 262H and a delay time of 263H for every one field, by keeping the vertical transfer gate $40_1$ in the closed state, constantly operating the input horizontal transfer register 62, repeating a sequence in which one of the output horizontal transfer registers 65 and $41_1$ is operated during a first time period of 262H and both the output horizontal transfer registers 65 and $41_1$ are operated during a second time period of 1H and the other of the output horizontal transfer registers 65 and $41_1$ is operated during a third time period of 262H, and performing the vertical transfer at a rate of once per 1H.

In addition, the input composite video signal a may be applied to the terminal 52b of the switching circuit 52 shown in FIG. 5. On the other hand, a constant voltage corresponding to the pedestal level of the input composite video signal and the like may be applied to the terminal 76b of the switching circuit 76 shown in FIG. 9. Further, because the signal lack occurs at a specific position within the horizontal blanking period or the vertical blanking period, the reproduced picture will not become greatly deteriorated even when the switching circuits 52 and 76 are not provided, and it is thus possible to omit the switching circuits 52 and 76. Moreover, in a case where the delay circuit which is designed to switch the delay time for every one field is used within a noise reduction circuit in a reproducing system of the VTR, it is possible to use the known drum pulse as a reference signal for switching and operating the input or output horizontal transfer registers for every one field.

The semiconductor delay circuit part is not limited to those shown in FIGS. 5 and 9. For example, it is possible to provide three or more rows of input horizontal transfer registers and output horizontal transfer registers. In this case, it is possible to selectively obtain a desired delay time from among a plurality of delay times including the delay times described before and other delay times.

Further, the present invention is not limited to these embodiments, but various variation and modifications may be made without departing from the scope of the present invention.

What is claimed is:

1. A video signal delay circuit comprising:
   a plurality of input horizontal transfer registers which are arranged in rows and serially supplied with an input composite video signal, each of said plurality of input horizontal transfer registers transferring horizontally sampled signals every time an input horizontal transfer clock pulse is applied thereto, said sampled signals being obtained by sampling the input composite video signal by the input horizontal transfer clock pulse;
   switching means for selectively supplying the input composite video signal to one of said plurality of input horizontal transfer registers;
   a plurality of input vertical transfer gates provided on parallel output sides of the respective plurality of input horizontal transfer registers, each of said input vertical transfer gates being supplied in parallel with the sampled signals from a corresponding input horizontal transfer register among the plurality of input horizontal transfer registers and passing the sampled signals during a time period in which said corresponding input horizontal transfer register does not perform a horizontal transfer;
   a plurality of vertical transfer registers which are arranged in columns to cross said plurality of input horizontal transfer registers, said plurality of vertical transfer registers being supplied with the sampled signals from one of said plurality of input vertical transfer gates, each of said vertical transfer registers having a constant number of stages and successively transferring vertically a sampled signal supplied thereto every time a vertical transfer clock pulse is applied thereto;
   at least one output vertical transfer gate for gating parallel output signals of said plurality of vertical transfer registers;
   at least one output horizontal transfer register which is arranged in a row, each of said at least one output horizontal transfer register temporarily storing parallel output signals of a corresponding output vertical transfer gate among said at least one output vertical transfer gate and transferring horizontally the stored signals every time an output horizontal transfer clock pulse is applied thereto so as to serially produce a delayed composite video signal;

a horizontal transfer clock pulse generating circuit for generating the input and output horizontal transfer clock pulses based on a horizontal synchronizing signal within the input composite video signal;

a vertical transfer clock pulse generating circuit for generating the vertical transfer clock pulse at a rate of once per one horizontal scanning period of the input composite video signal based on the horizontal and vertical synchronizing signals within the input composite video signal and for supplying the vertical transfer clock pulse to said plurality of vertical transfer registers;

horizontal transfer register selecting means for selectively supplying the output horizontal transfer clock pulse of said horizontal transfer clock pulse generating circuit to an arbitrarily selected one of said plurality of input horizontal transfer registers and to an arbitrarily selected one of said at least one output horizontal transfer register based on at least the horizontal and vertical synchronizing signals within the input composite video signal, said horizontal transfer register selecting means selectively obtaining said delayed composite video signal from only said arbitrarily selected one of said at least one output horizontal transfer register;

control means for controlling said switching means to selectively supply the input composite video signal to said arbitrarily selected one of said plurality of input horizontal transfer registers; and a vertical transfer gate pulse generating circuit for generating a vertical transfer gate pulse in phase synchronism with said vertical transfer clock pulse based on the horizontal and vertical synchronizing signals within the input composite video signal, said vertical transfer gate pulse generating circuit supplying the vertical transfer gate pulse to one of said plurality of input vertical transfer gates coupled to the parallel output side of said arbitrarily selected one of said plurality of input horizontal transfer registers and to one of said at least one output vertical transfer gate coupled to a parallel input side of said arbitrarily selected one of said at least one output horizontal transfer register so as to open said one input vertical transfer gate and said one output vertical transfer gate.

2. A video signal delay circuit as claimed in claim 1 in which said plurality of input horizontal transfer registers comprise a first input horizontal transfer register arranged in a first row and a second input horizontal transfer register arranged in a second row, said at least one output horizontal transfer register comprise a first output horizontal transfer register arranged in a 314-th row and a second output horizontal transfer register arranged in a 264-th row, and said plurality of vertical transfer registers are arranged from the second to the 313-th rows so that said second input horizontal transfer register and said second output horizontal transfer register constitute a part of said plurality of vertical transfer registers.

3. A video signal delay circuit as claimed in claim 2 in which said horizontal transfer register selecting means comprises an input terminal for receiving a discrimination signal indicative of the number of scanning lines employed in said input composite video signal, said horizontal transfer register selecting means performing a sequence in which the horizontal transfer clock pulse is supplied to said first input horizontal transfer register during a first time period of $N_1$, supplied simultaneously to said first and second input horizontal transfer registers during a second time period of one horizontal scanning period and supplied to said second input horizontal transfer register during a third time period of $N_2$, where $N_1$ represents a time period of one field plus 0.5 horizontal scanning periods and $N_2$ represents a time period of one field minus 0.5 horizontal scanning periods, said sequence is performed with a period of two fields, said horizontal transfer register selecting means constantly supplies the horizontal transfer clock pulse to one of said first and second output horizontal transfer registers, and a composite video signal delayed by a predetermined delay time is obtained from said arbitrarily selected one of said at least one output horizontal transfer register which predetermined delay time alternately changes between said first time period $N_1$ and said third time period $N_2$ for every one field.

4. A video signal delay circuit as claimed in claim 3 in which said horizontal transfer register selecting means switches the supply of the horizontal transfer clock pulse to said first and second input horizontal transfer registers for every one field, within a vertical blanking period of said input composite video signal.

5. A video signal delay circuit as claimed in claim 1 which further comprises a switch circuit having a first terminal applied with an output composite video signal of said arbitrarily selected one of said at least one output horizontal transfer register and a second terminal applied with a constant voltage or said input composite video signal, said switch circuit selectively passes the signal applied to said second terminal at least during a time period in which the vertical transfer gate pulse is generated from said vertical transfer gate pulse generating circuit, and said switch circuit selectively passes the signal applied to said first terminal during other time periods.

6. A video signal delay circuit as claimed in claim 1 in which said plurality of input horizontal transfer registers comprise a first input horizontal transfer register arranged in a first row and a second input horizontal transfer register arranged in a 51-st row, said at least one output horizontal transfer register comprise a first output horizontal transfer register arranged in a 314-th row and a second output horizontal transfer register arranged in a 313-th row, and said plurality of vertical transfer registers are arranged from the second to the 313-th rows so that said second input horizontal transfer register and said second output horizontal transfer register constitute a part of said plurality of vertical transfer registers.

7. A video signal delay circuit as claimed in claim 6 in which said horizontal transfer register selecting means comprises an input terminal for receiving a discrimination signal indicative of the number of scanning lines employed in said input composite video signal, said horizontal transfer register selecting means alternately supplies the horizontal transfer clock pulse to said first and second output horizontal transfer registers with a period of two fields so that the horizontal transfer clock pulse is supplied to said first output horizontal transfer register during a first time period of $N_1$ and is supplied to said second output horizontal transfer register during a second time period of $N_2$, where $N_1$ represents a time period of one horizontal scanning period plus 0.5 horizontal scanning periods and $N_2$ represents a time period of one field minus 0.5 horizontal scanning periods, said horizontal transfer register selecting means constantly supplies the horizontal transfer clock pulse to one of said first and second input horizontal transfer registers, and a composite video signal delayed by a predetermined delay time is obtained from one of said first and second output horizontal transfer registers supplied with said horizontal transfer clock pulse which predetermined delay time alternately changes between said first time period $N_1$ and said second time period $N_2$ for every one field.

8. A video signal delay circuit as claimed in claim 7 in which said horizontal transfer register selecting means switches the supply of the horizontal transfer clock pulse to said first and second input horizontal transfer registers for every one field, within a vertical blanking period of said input composite video signal.

9. A video signal delay circuit comprising:
at least one input horizontal transfer register which is arranged in a row and serially supplied with an input composite video signal, each of said at least one input horizontal transfer register transferring horizontally sampled signals every time an input horizontal transfer clock pulse is applied thereto, said sampled signals being obtained by sampling the input composite video signal by the input horizontal transfer clock pulse;
at least one input vertical transfer gate provided on a parallel output side of each of said at least one input horizontal transfer register, each of said at least one input vertical transfer gate being supplied in parallel with the sampled signals from a corresponding input horizontal transfer register among said at least one input horizontal transfer register and passing the sampled signals during a time period in which said corresponding input horizontal transfer register does not perform a horizontal transfer;
a plurality of vertical transfer registers which are arranged in columns to cross said at least one input horizontal transfer register, said plurality of vertical transfer registers being supplied with the sampled signals from one of said at least one input vertical transfer gate, each of said vertical transfer registers having a constant number of stages and successively transferring vertically a sampled signal supplied thereto every time a vertical transfer clock pulse is applied thereto;
a plurality of output vertical transfer gates for gating parallel output signals of said plurality of vertical transfer registers;
a plurality of output horizontal transfer registers which are arranged in rows, each of said plurality of output horizontal transfer registers temporarily storing parallel output signals of a corresponding output vertical transfer gate among said plurality of output vertical transfer gates and transferring horizontally the stored signals every time an output horizontal transfer clock pulse is applied thereto so as to serially produce a delayed composite video signal;
switching means for selectively receiving said delayed composite video signal from one of said plurality of output horizontal transfer registers;
a horizontal transfer clock pulse generating circuit for generating the input and output horizontal transfer clock pulses based on a horizontal synchronizing signal within the input composite video signal;
a vertical transfer clock pulse generating circuit for generating the vertical transfer clock pulse at a rate of once per one horizontal scanning period of the input composite video signal based on the horizontal and vertical synchronizing signals within the input composite video signal and for supplying the vertical transfer clock pulse to said plurality of vertical transfer registers;
horizontal transfer register selecting means for selectively supplying the output horizontal transfer clock pulse of said horizontal transfer clock pulse generating circuit to an arbitrarily selected one of said at least one input horizontal transfer register and to an arbitrarily selected one of said plurality of output horizontal transfer registers based on at least the horizontal and vertical synchronizing signals within the input composite video signal, said horizontal transfer register selecting means supplying the input composite video signal to said arbitrarily selected one of said at least one input horizontal transfer register;
control means for controlling said switching means to selectively receive said delayed composite video signal from said arbirarily selected one of said plurality of output horizontal transfer registers; and
a vertical transfer gate pulse generating circuit for generating a vertical transfer gate pulse in phase synchronism with said vertical transfer clock pulse based on the horizontal and vertical synchronizing signals within the input composite video signal, said vertical transfer gate pulse generating circuit supplying the vertical transfer gate pulse to one of said at least one input vertical transfer gate coupled to the parallel output side of said arbitrarily selected one of said at least one input horizontal transfer register and to one of said plurality of output vertical transfer gates coupled to a parallel input side of said arbitrarily selected one of said plurality of output horizontal transfer registers so as to open said one input vertical transfer gate and said one output vertical transfer gate.

* * * * *